(12) United States Patent
Lee

(10) Patent No.: US 6,214,672 B1
(45) Date of Patent: Apr. 10, 2001

(54) METHOD FOR MANUFACTURING TWO-BIT FLASH MEMORY

(75) Inventor: Robin Lee, Hsinchu Hsien (TW)

(73) Assignees: United Semiconductor Corp.; United Microelectronics Corp., both of Hsinchu (TW)

(*) Notice: Subject to any disclaimer, the term of this patent is extended or adjusted under 35 U.S.C. 154(b) by 0 days.

(21) Appl. No.: 09/428,356

(22) Filed: Oct. 28, 1999

(51) Int. Cl.⁷ .............................................. H01L 21/8247
(52) U.S. Cl. ........................ 438/261; 438/287; 438/591
(58) Field of Search .................................. 438/257, 261, 438/264, 287, 288, 591, 595

(56) References Cited

U.S. PATENT DOCUMENTS

| | | | |
|---|---|---|---|
| 4,306,353 | * 12/1981 | Jacobs et al. | 438/287 |
| 4,342,149 | * 8/1982 | Jacobs et al. | 438/287 |
| 5,387,534 | * 2/1995 | Prall | 438/287 |

* cited by examiner

*Primary Examiner*—Chandra Chaudhari
(74) *Attorney, Agent, or Firm*—Charles C. H. Wu; Charles C. H. Wu & Associates, APC

(57) ABSTRACT

A method of manufacturing a two-bit flash memory. A substrate has a thin oxide layer, a silicon nitride layer and a material layer formed thereon in sequence. An opening is formed in the material layer and the silicon nitride layer to expose a portion of the thin oxide layer. A source/drain region is formed in the substrate beneath the portion of the thin oxide layer exposed by the opening. A first dielectric layer is formed in the opening. A portion of the material layer and a portion of the silicon nitride layer are removed to form a spacer on the sidewall of the first dielectric layer. The remaining material layer is removed. A portion of the thin oxide layer exposed by the remaining silicon nitride layer and the first dielectric layer is removed. A second dielectric layer is formed on a portion of the substrate exposed by the remaining thin oxide layer. A control gate is formed over the substrate.

16 Claims, 3 Drawing Sheets

METHOD FOR MANUFACTURING TWO-BIT FLASH MEMORY

BACKGROUND OF THE INVENTION

1. Field of Invention

The present invention relates to a method for manufacturing a flash memory. More particularly, the present invention relates to a method for manufacturing a two-bit flash memory.

2. Description of Related Art

A conventional flash memory is a type of erasable programmable read-only memory (EPROM), which in turn is a type of non-volatile memory. One of the advantages of flash memory is its capacity for block-by-block memory erasure. Furthermore. the speed of memory erasure is fast, and normally takes just 1 to 2 seconds for the complete removal of a whole block of memory. For most other EPROM, memory erasure can take up to several minutes due to its bit-by-bit operation.

Typically, flash memory is constructed from a metal-oxicle-semiconductor transistor with an electrically changeable threshold voltage. The silicon nitride oxide semiconductor (SNOS) is one kind of flash memory.

FIG. 1 is a schematic, cross-sectional view of a conventional two-bit SNOS memory. The components of the SNOS memory comprise a source/drain region 102 formed in the substrate 100, a thin oxide layer 104 formed on a portion of the substrate 100 between the source/drain regions 102 and a silicon nitride layer 106 formed on the thin oxide layer 104. This structure further comprises a polysilicon gate 108 formed on the silicon nitride layer 106.

When the flash memory stores data, a high voltage is applied to the source/drain region 102 and the polysilicon gate 108 to induce hot electrons. The hot electrons flow from the source/drain region 102 and vertically penetrate through the thin oxide layer 104 near the source/drain region 104 to be trapped in a portion of the nitride layer 106 near the source/drain region 102. Therefore, each end of the silicon nitride layer 106 stores one bit. Specifically, a SNOS memory cell can store two bits.

However, the hot electrons trapped in the silicon nitride layer 106 are unstable at both ends of the silicon nitride layer 106. It is easy to induce a redistribution effect of the hot electrons, so that the hot electrons spread over the silicon nitride layer 106. The hot electrons respectively injected from the source region and the drain region are remixed and spread over the silicon nitride layer 106. Hence, the operation performance of the flash memory is restricted and the problem of over-programming occurs.

SUMMARY OF THE INVENTION

The invention provides a method of manufacturing a two-bit flash memory. A substrate is provided. The substrate has a thin oxide layer, a silicon nitride layer and a material layer formed thereon in sequence. An opening is formed in the material layer and the silicon nitride layer to expose a portion of the thin oxide layer. A source/drain region is formed in the substrate beneath the portion of the thin oxide layer exposed by the opening. A first dielectric layer is formed in the opening. A portion of the material layer and a portion of the silicon nitride layer are removed to form a spacer on the sidewall of the first dielectric layer. The remaining material layer is removed. A portion of the thin oxide layer exposed by the remaining silicon nitride layer and the first dielectric layer is removed. A second dielectric layer is formed on a portion of the substrate exposed by the remaining thin oxide layer. A control gate is formed over the substrate.

In the invention, the silicon nitride layer is separated by a dielectric layer into two silicon nitride layers, each used to store one bit. Since the two silicon nitride layers are electrically isolated from each other by the dielectric layer, the two-bit storage and the over-programming problems can be overcome.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2F are schematic, cross-sectional views of the process for manufacturing a two-bit flash memory in a preferred embodiment according to the invention.

Figure 1:
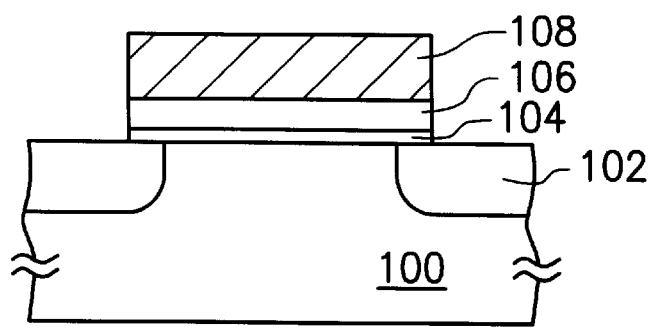
FIG. 1 is a schematic, cross-sectional view of a conventional two-bit SNOS memory.
Figure 2A:
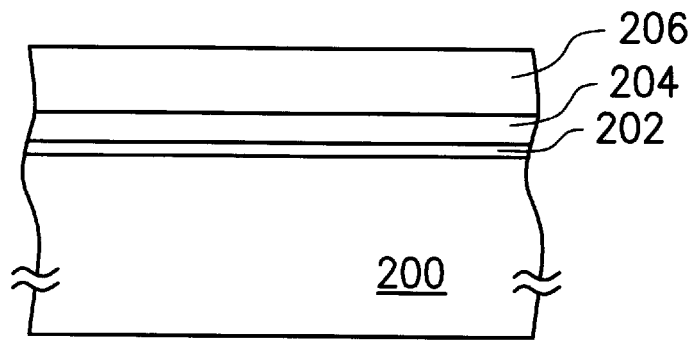
FIGS. 2A through 2F are schematic, cross-sectional views of the process for manufacturing a two-bit flash memory in a preferred embodiment according to the invention.

As shown in FIG. 2A, a thin oxide layer 202, a silicon nitride layer 204 and a material layer 206 are formed on a substrate 200 in sequence. The thickness of the thin oxide layer 202 is less than 30 angstroms, for example. Additionally, the silicon nitride layer 204 can be formed by chemical vapor deposition (CVD) and the thickness of the silicon nitride layer 204 is of about 100–200 angstroms, for example. Incidentally, the material layer 206 and the silicon nitride layer 204 have different etching rates. Moreover, the material layer 206 can be formed from polysilicon by CVD.

Figure 2B:
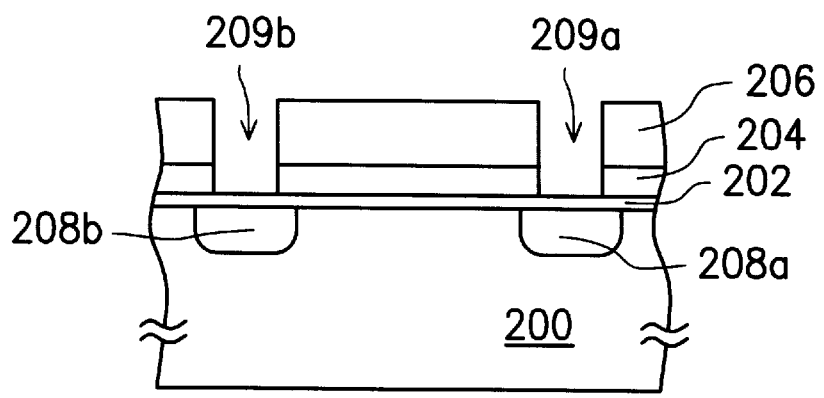

As shown in FIG. 2B, the material layer 206 and the silicon nitride layer 204 are patterned to form openings 209a and 209b in the material layer 206 and the silicon nitride layer 204. Both openings 209a and 209b expose a portion of the thin oxide layer 202. An ion implantation process is performed to form source/drain regions 208a and 208b in the substrate 200 under the portion of the thin oxide layer exposed by the openings 209a and 209b. The doped ions in the ion implantation process can be arsenic ions and the dosage of the doped ions is of about $10^{15}$ atoms/cm$^2$, for example. Since the thin oxide layer 202 is located on the substrate 200 in the opening, the thin oxide layer 202 can protect the substrate 200 from the damage induced by the ion implantation process.

Figure 2C:
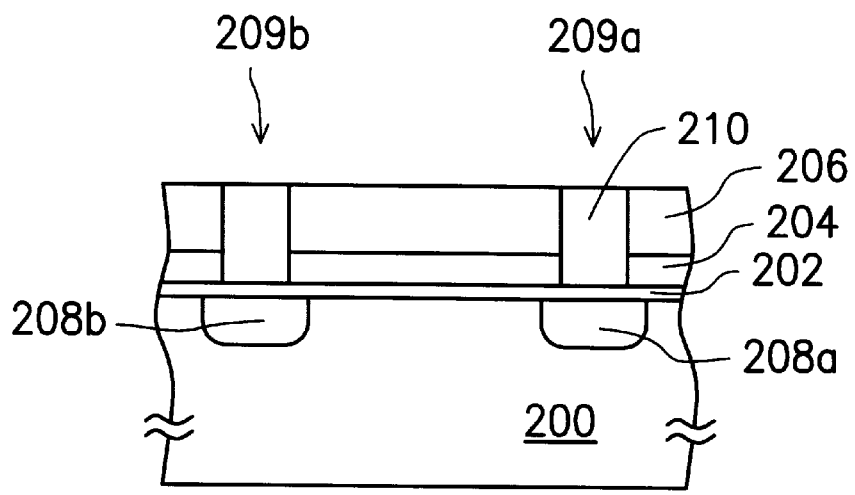

As shown in FIG. 2C, a dielectric layer 210 is formed in the openings 209a and 209b and the dielectric layer 210 fills the openings 209a and 209b. The dielectric layer 210 and the material layer 206 have different etching rates. The method of forming the dielectric layer 210 comprises the steps of forming a silicon oxide layer (not shown) over the substrate 200 by CVD and filling the openings 209a and 209b and then removing a portion of the silicon oxide layer until the surface of the material layer is exposed.

Figure 2D:
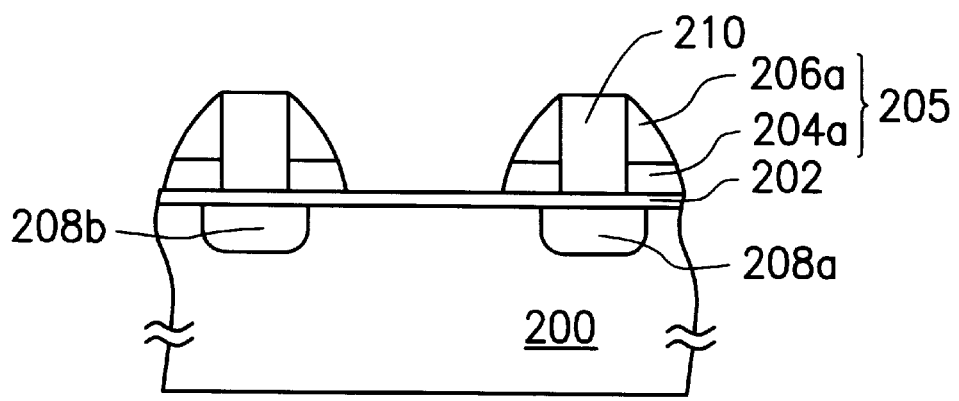

As shown in FIG. 2D, a portion of the material layer 206 and a portion of the silicon nitride layer 204 are removed to form a spacer 205 on the sidewall of the dielectric layer 205 and to expose a portion of the thin oxide layer 202 between the source/drain regions 208a and 208b. The spacer 205 is constructed of the remaining material layer 206a and the remaining silicon nitride layer 204a. The method of removing the portion of the material layer 206 and the portion of the silicon nitride layer 204 can be anisotropic etching, for example.

Figure 2E:
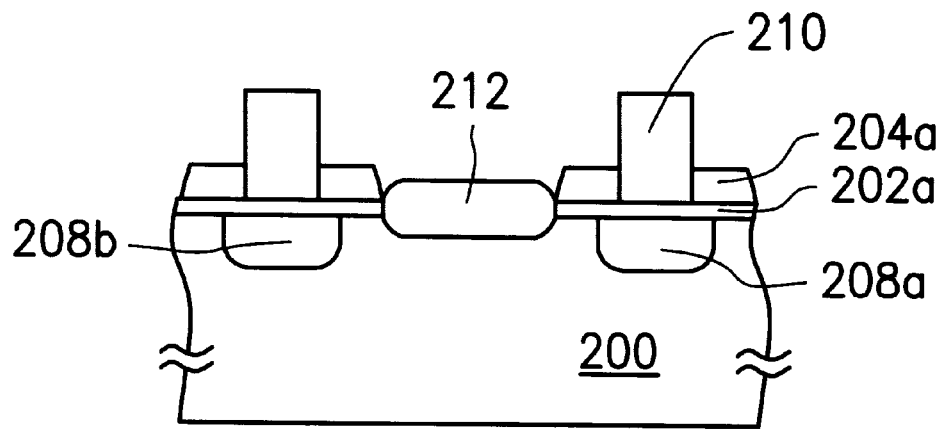

As shown in FIG. 2E, the remaining material layer 206a up to the surface of the remaining silicon nitride layer 204a and a portion of the sidewall of the dielectric layer 210 are exposed. A portion of the thin oxide layer 202 is removed by using the remaining silicon nitride layer 204a and the dielectric layer 210 as masks until a portion of the substrate 200 is exposed. The remaining thin oxide layer 202 is denoted as a thin oxide layer 202a.

An oxidation process is performed to form a dielectric layer 212 on the portion of the substrate 200 exposed by the thin oxide layer 202a. The oxidation process can be thermal oxidation, for example.

The dielectric layer 210 formed on the portion of the substrate 200 exposed by the thin oxide layer 202a can electrically isolate the silicon nitride layer 204a used to store hot electrons. Obviously, there are two silicon nitride layer 204a used to store hot electrons. In the same words, the flash memory provided by the invention is a two-bit flash memory without inducing redistribution effect. Therefore, the hot electrons respectively flowing from the source/drain regions 208a and 208b penetrate through the thin oxide layer 202a and are trapped in the silicon nitride layer 204a. Because of the isolation function of the dielectric layer 212, the two-bit storage problem caused by the redistribution effect can be overcome. Furthermore, the overprogramming problem can be overcome.

Figure 2F:
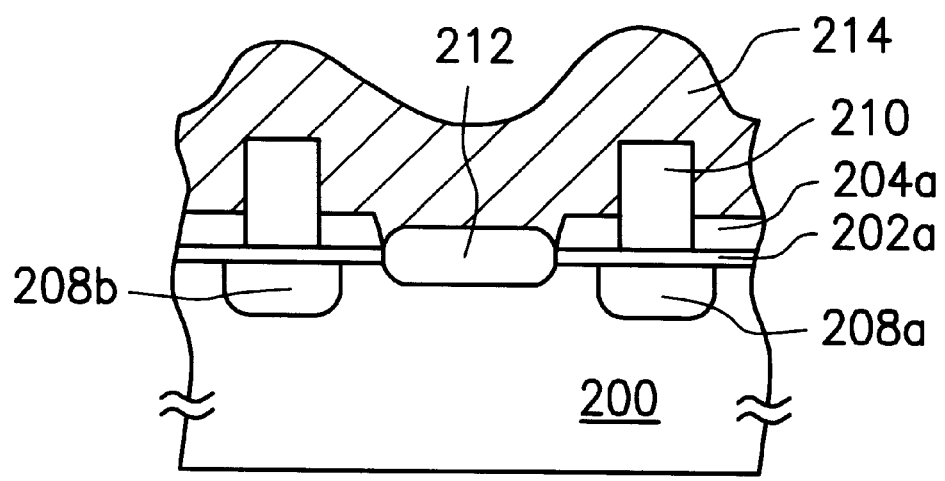

As shown in FIG. 2F, a conductive layer (not shown) is formed over the substrate 200. The conductive layer is patterned to form a control gate 214 to finish the process of manufacturing two-bit flash memory.

In the invention, the silicon nitride layer formed on a portion of the substrate between the source/drain regions is separated into two silicon nitride layers used to respectively store one bit by a dielectric layer. Since the two silicon nitride layers are electrically isolated from each other by the dielectric layer, the two-bit storage and the overprogramming problems can be overcome.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a two-bit flash memory, comprising the steps of:

providing a substrate;

forming a thin oxide layer, a silicon nitride layer and a material layer on the substrate in sequence;

forming a first opening and a second opening in the material layer and the silicon nitride layer to expose a portion of the thin oxide layer;

forming a first source/drain region and a second source/drain region in the substrate beneath portions of the thin oxide layer respectively exposed by the first and the second openings;

forming a first dielectric layer in the first and the second openings;

removing a portion of the material layer and a portion of the silicon nitride layer to form a spacer on a sidewall of the first dielectric layer and to expose a portion of the thin oxide layer between the first and the second source/drain regions;

removing the remaining material layer;

removing a portion of the thin oxide layer exposed by the remaining silicon nitride layer and the first dielectric layer;

performing an oxidation process to form a second dielectric layer on a portion of the substrate exposed by the remaining thin oxide layer; and forming a control gate over the substrate.

2. The method of claim 1, wherein a thickness of the thin oxide layer is smaller than 30 angstroms.

3. The method of claim 1, wherein a thickness of the silicon nitride layer is about 100–200 angstroms.

4. The method of claim 1, wherein the oxidation process includes thermal oxidation.

5. The method of claim 1, wherein the material layer and the silicon nitride layer have different etching rates.

6. The method of claim 5, wherein the material layer is formed from polysilicon layer by chemical vapor deposition.

7. The method of claim 1, wherein the first dielectric layer and the material layer have different etching rates.

8. The method of claim 1, wherein the first dielectric layer includes a silicon oxide layer.

9. A method of manufacturing a two-bit flash memory, comprising the steps of:

providing a substrate, wherein the substrate has a thin oxide layer, a silicon nitride layer and a material layer formed thereon in sequence;

forming an opening in the material layer and the silicon nitride layer to expose a portion of the thin oxide layer;

forming a source/drain region in the substrate beneath the portion of the thin oxide layer exposed by the opening;

forming a first dielectric layer in the opening;

removing a portion of the material layer and a portion of the silicon nitride layer to form a spacer on a sidewall of the first dielectric layer;

removing the remaining material layer;

removing a portion of the thin oxide layer exposed by the remaining silicon nitride layer and the first dielectric layer;

forming a second dielectric layer on a portion of the substrate exposed by the remaining thin oxide layer; and forming a control gate over the substrate.

10. The method of claim 9, wherein a thickness of the thin oxide layer is smaller than 30 angstroms.

11. The method of claim 9, wherein a thickness of the silicon nitride layer is about 100–200 angstroms.

12. The method of claim 9, wherein the step of forming the second oxide layer includes a thermal oxidation.

13. The method of claim 9, wherein the material layer and the silicon nitride layer have different etching rates.

14. The method of claim 13, wherein the material layer is formed from polysilicon layer by chemical vapor deposition.

15. The method of claim 9, wherein the first dielectric layer and the material layer have different etching rates.

16. The method of claim 9, wherein the first dielectric layer includes a silicon oxide layer.

* * * * *